(12) United States Patent
Kang

(10) Patent No.: US 7,872,488 B2
(45) Date of Patent: Jan. 18, 2011

(54) TESTER FOR TESTING SEMICONDUCTOR DEVICE

(75) Inventor: Jong Koo Kang, Yongin-si (KR)

(73) Assignee: UniTest Inc., Yongin-si (KR)

( * ) Notice: Subject to any disclaimer, the term of this patent is extended or adjusted under 35 U.S.C. 154(b) by 377 days.

(21) Appl. No.: 11/828,024

(22) Filed: Jul. 25, 2007

(65) Prior Publication Data

US 2008/0030218 A1 Feb. 7, 2008

(30) Foreign Application Priority Data

Aug. 1, 2006 (KR) .................. 10-2006-0072747

(51) Int. Cl.
*G01R 31/26* (2006.01)
(52) U.S. Cl. .................................. 324/765
(58) Field of Classification Search .............. 324/158.1, 324/763, 765; 360/26
See application file for complete search history.

(56) References Cited

U.S. PATENT DOCUMENTS

| 5,416,409 | A  | * | 5/1995  | Hunter    | 324/158.1 |
|-----------|----|---|---------|-----------|-----------|
| 6,327,678 | B1 | * | 12/2001 | Nagai     | 714/700   |
| 6,779,140 | B2 | * | 8/2004  | Krech et al. | 714/718 |
| 6,831,473 | B2 | * | 12/2004 | Iorga     | 324/765   |
| 7,372,287 | B2 | * | 5/2008  | Ezoe      | 324/765   |
| 7,595,629 | B2 | * | 9/2009  | Miller    | 324/158.1 |

* cited by examiner

*Primary Examiner*—Ha Tran T Nguyen
*Assistant Examiner*—Joshua Benitez
(74) *Attorney, Agent, or Firm*—Sughrue Mion, PLLC

(57) ABSTRACT

A tester for testing a semiconductor device is disclosed. In accordance with the tester of the present invention, the tester is configured to have different drive signal path and input/output signal path wherein the drive signal path has a fly-by structure, i.e. a daisy chain structure and the input/output signal path has a star-stub structure such that more DUTs may be tested simultaneously and an integrity of the signals is secured.

7 Claims, 2 Drawing Sheets

<Prior Art>

TESTER FOR TESTING SEMICONDUCTOR DEVICE

BACKGROUND OF THE INVENTION

1. Field of the Invention

The present invention relates to a tester for testing a semiconductor device, and in particular to a tester for testing a semiconductor device that is configured to have different drive signal path and input/output signal path such that more DUTs may be tested simultaneously and an integrity of the signals is secured.

2. Description of Prior Art

A tester for testing a semiconductor device tests whether the semiconductor device is defective. The tester for testing the semiconductor device is designed and developed according to a development state of a memory device, a DRAM in particular which takes up most of the memory devices since the tester for testing the semiconductor device is mostly used for testing the memory devices.

The development of the DRAM is progressing from an EDO (Extended Data Output) DRAM, SDRAM (Synchronous DRAM), Rambus DRAM to DDR (Double Data Rate) DRAM.

In order to test the DRAM, a high speed and a high accuracy are required for the tester so as to correspond to a high speed DRAM. In addition, as a capacity of the memory is increased, a time required for testing the DRAM also increases. Therefore, a testing speed is also required to be increased. Moreover, a cost for testing the memory should be reduced by embodying a miniaturized and economical tester.

Of the tester for testing the semiconductor device, the memory tester in particular is typically used for testing and verifying a memory component or a memory module in a form of a SIMM or DIMM. The tester detects a functional defect of the memory module or the memory component prior to an installation thereof in a real computer system.

The tester is classified into a hardware semiconductor device tester and a software diagnostic program executed in a PC environment. However, since the software diagnostic program diagnoses a state of the memory when the memory module or the memory component is installed in the real computer, the hardware semiconductor device tester is mainly used during a semiconductor memory manufacturing process.

The tester may be classified as a high-end tester referred to as an ATE (Automatic Test Equipment), a medium range memory tester and a low-end memory tester.

The ATE which is the high-end tester is typically used in order to carry out a test process of the memory device. The conventional ATE carries out tests such as a DC test for testing whether a DC parameter is suitable for a digital operation of a circuit, a transmission delay time of signals, and an AC margin related to a set-up time and a hold time. The ATE also generates a test pattern and a timing for the test. However, a manufacturing cost of the ATE is high since the ATE is manufactured using a dedicated equipment such as a main frame having a large size and a high price.

FIG. 1 is a block diagram illustrating a conventional tester for testing a semiconductor device.

As shown in FIG. 1, the conventional tester comprises a pattern generator 110, a timing generator 120, a format controller 130, a driver 140, a comparator 150, and a test result storage 160. In addition to these components, the conventional tester may comprise a power supply controller for the DC test, a component for generating a clock signal, a component for supplying a power for an operation of a DUT (Device Under Test) 180, a component for relaying a test pattern data to the DUT 180 and receiving a test result from the DUT 180, a component for receiving a test pattern program from an outside, and a component for transmitting the test result to the outside. However, a description thereof is omitted.

The pattern generator 110 generates the test pattern data required for testing the DUT 180 based on the test pattern program. For instance, the test pattern program is written to include an instruction for carrying out various operations in order to carry out the test. The pattern generator 110 generates the test pattern data by receiving and interpreting the test pattern program from an external storage for instance. The test pattern data includes a data such as a command, address and a data inputted to the DUT 180. In addition, an expected data corresponding to the generated test pattern data is generated.

The timing generator 120 generates a timing edge which is a reference for converting the test pattern data generated in the pattern generator 110 into various waveforms. The timing edge is generated using a plurality of clocks for a smooth conversion.

The format controller 130 converts the test pattern data to a desired waveform based on the timing edge.

The driver 140 transmits the converted test waveform to the DUT 180.

The comparator 150 tests the DUT 180 by comparing the test output data being outputted from the DUT 180 after an operation of the DUT 180 is complete by the test waveform applied to the DUT 180 with the expected data generated in the pattern generator 110.

The test result storage 160 stores a test result based on a result of the comparison of the comparator 150. For instance, an information on a defective DUT is stored.

In accordance with the ATE of the tester for testing the semiconductor device in particular, an integrity of the signal is not guaranteed since a distance between an ALPG and a DUT board is long.

SUMMARY OF THE INVENTION

It is an object of the present invention to provide a tester for testing a semiconductor device that is configured to have different drive signal path and input/output signal path such that more DUTs may be tested simultaneously and an integrity of the signals is secured.

In order to achieve the above-described objects of the present invention, there is provided a tester for testing a semiconductor device, the tester comprising: a DUT interface board for mounting a plurality of DUTs, wherein a drive signal input terminal of each of the plurality of DUTs is connected to each other so as to form a daisy chain; a pattern generator for applying a drive signal to the drive signal input terminal forming the daisy chain and for applying an input signal to a test signal input terminal of each of the plurality of DUTs; a first terminator connected to an end of the daisy chain; and a data comparator for comparing an output signal being outputted from a test signal output terminal of each of the plurality of DUTs with the input signal.

There is also provided a tester for testing a semiconductor device, the tester including: a drive signal path for applying a drive signal to a drive signal input terminal of each of a plurality of DUTs; an input signal path for applying an input signal to a test signal input terminal of each of the plurality of DUTs; and an output signal path for comparing an output signal being outputted from a test signal output terminal of each of the plurality of DUTs with the input signal, wherein the drive signal input terminal of each of the plurality of DUTs in the drive signal path is connected so as to form a daisy chain, and the input signal is applied to the test signal input terminal of each of the plurality of DUTs in the input signal path.

There is also provided a tester for testing a semiconductor device, the tester comprising: a DUT interface board for mounting a plurality of DUTs, wherein a drive signal input terminal of each of the plurality of DUTs is connected to each other so as to form a daisy chain; a pattern generator for generating a drive signal, an input signal and a drive enable signal; a first deskew for removing a skew of the drive signal; a second deskew for removing a skew of the drive enable signal and the input signal; a first driver for applying the drive signal being outputted from the first deskew to the daisy chain; a second driver for applying the input signal being outputted from the second deskew to a test signal input terminal of each of the plurality of DUTs according to the drive enable signal being outputted from the second deskew; and a data comparator for comparing an output signal being outputted from the test signal output terminal of each of the plurality of DUTs with the input signal.

DETAILED DESCRIPTION OF THE PREFERRED EMBODIMENTS

The present invention will now be described in detail with reference to the accompanied drawings.

Figure 1:
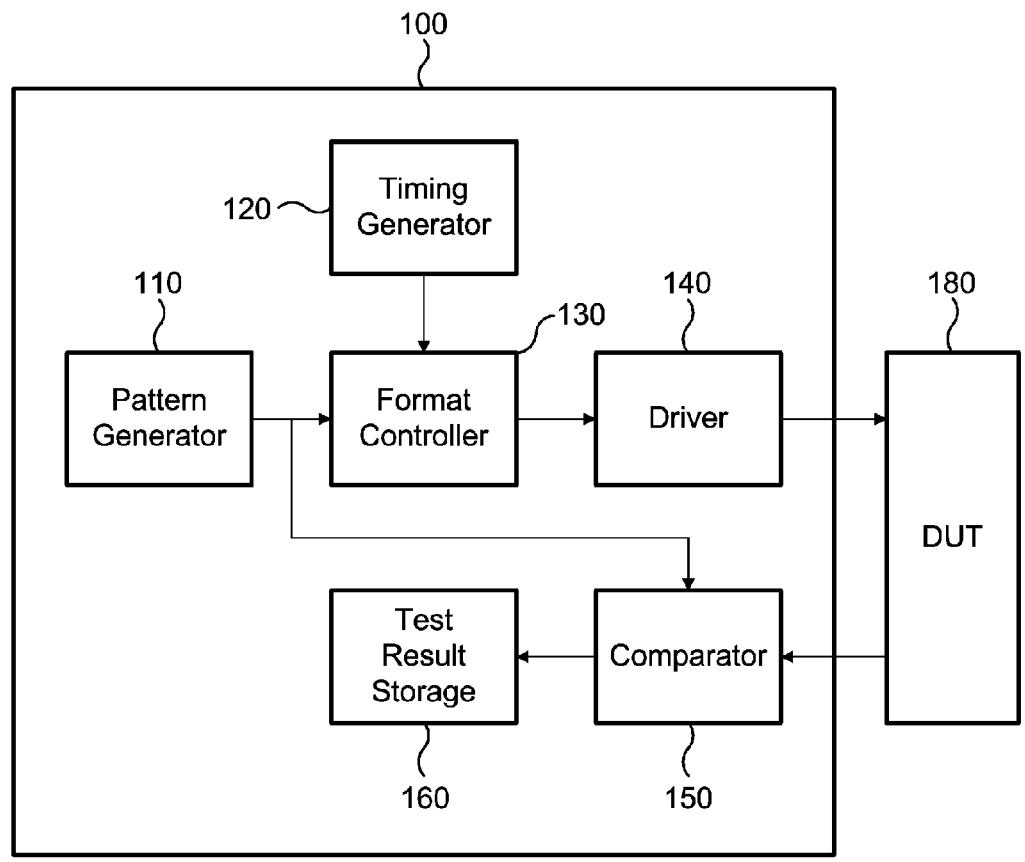
FIG. 1 is a block diagram illustrating a conventional tester for testing a semiconductor device.
Figure 2:
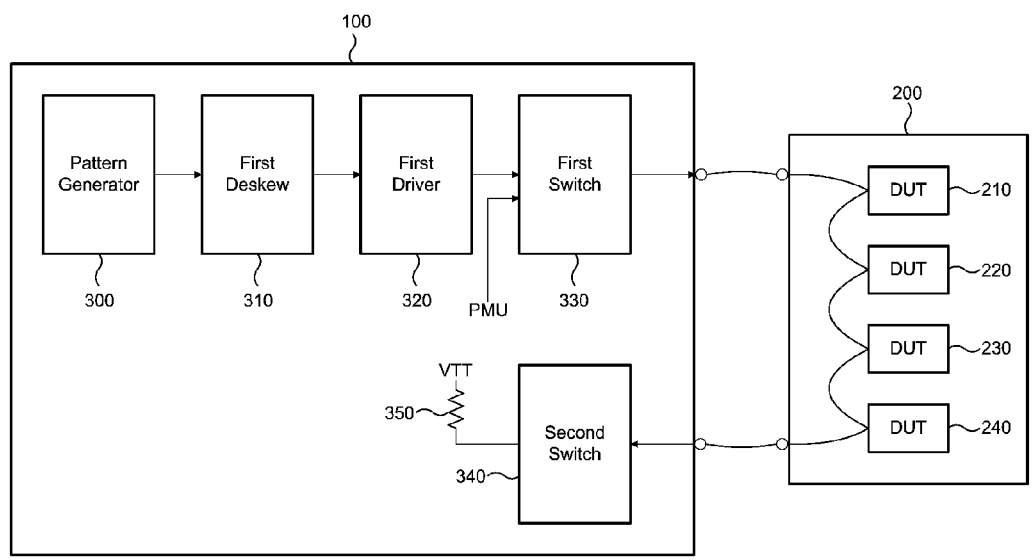
FIG. 2 is a block diagram illustrating a drive signal path of a tester for testing a semiconductor device in accordance with the present invention.

FIG. 2 is a block diagram illustrating a drive signal path of a tester for testing a semiconductor device in accordance with the present invention, wherein the drive signal path refers to a path via which a drive signal is transmitted.

Referring to FIG. 2, a tester for testing a semiconductor device in accordance with the present invention comprises a pattern generator 300, a DUT interface board 200 and a first terminator 350. In addition, the tester for testing the semiconductor device in accordance with the present invention may further comprise a first deskew 310, a first driver 320, a first switch 330 and a second switch 340.

The pattern generator 300, the first deskew 310, the first driver 320, the first switch 330, the second switch 340 and the first terminator 350 may be disposed on a PGB (Pattern Generation Board).

The pattern generator 300 generates and outputs a drive signal DR, an input signal and a drive enable signal. The pattern generator 300 may comprise an ALPG (ALgorithm Pattern Generator). The ALPG is a device that outputs a signal of a desired pattern according to a program stored by a user. The ALPG may be embodied using an FGPA (Field Programmable Gate Array).

The DUT interface board 200 may comprise a plurality of sockets for inserting a plurality of DUTs. Each of the plurality of DUTs comprises a drive signal input terminal which is connected to each other by a fly-by structure, i.e. a daisy chain. The daisy chain refers to a configuration wherein hardware devices are sequentially connected. For instance, a DUT 210 is connected to a DUT 220, the DUT 220 is connected to a DUT 230, and the DUT 230 is connected to a DUT 240. Therefore, a pin of each of the sockets for inserting the DUTs 210, 220, 230 and 240 disposed on the DUT interface board 200 that corresponds to a drive signal input terminal of the DUTs 210, 220, 230 and 240 is connected so as to form the daisy chain. Since the drive signal is shared by two or four DUTs in order to test more DUTs simultaneously, an integrity of the signal is improved by the fly-by structure instead of a conventional star-stub structure.

The first terminator 350 is connected to an end of the daisy chain to prevent a reflection of the drive signal.

The first deskew 310 removes a skew included in the drive signal being outputted from the pattern generator 300.

The first driver 320 applies the drive signal having the skew thereof removed to the drive signal input terminal connected in the daisy chain.

The first switch 330 applies one of the drive signal having the skew thereof removed and a DC test signal to the daisy chain. The first switch 330 may comprise relays. It is preferable that a relay that relays the drive signal has a small turn-on resistance in order to minimize a distortion of the signal. In addition, it is preferable that a relay that relays the DC test signal has a small turn-off capacitance.

The second switch 340 is disposed between an end of the daisy chain and the first terminator 350, which is opened when the DC test signal is applied. The second switch 340 may comprise a relay. It is preferable that the relay has a small turn-on resistance. It is preferable that the relays included in the first switch 330 and the second switch 340 have a small insertion loss and a small return loss.

A process for transmitting the drive signal in the tester for testing the semiconductor device in accordance with the present invention is described below in detail.

The pattern generator 300 generates the drive signal DR and outputs the same to the first deskew 310. The first deskew 310 removes the skew included in the drive signal DR to be outputted to the first driver 320.

The first driver 320 generates the drive signal having a logical value of 'H' or 'L' for driving the DUT to be applied to the first switch 330. The first switch 330 applies the DC test signal being outputted to a PMU to the DUT when carrying out a DC test, and applies the drive signal being outputted from the first driver 320 to an input terminal of the daisy chain otherwise. When the DC test signal is applied, the second switch 340 is opened to prevent the DC test signal from being transmitted to the first terminator 350.

The drive signal DR that passed trough the first switch 330 is sequentially inputted to the DUTs 210, 220, 230 and 240, The first terminator 350 is connected to the end of the daisy chain, wherein the first terminator 350 including a resistor prevents the drive signal from being reflected.

Figure 3:
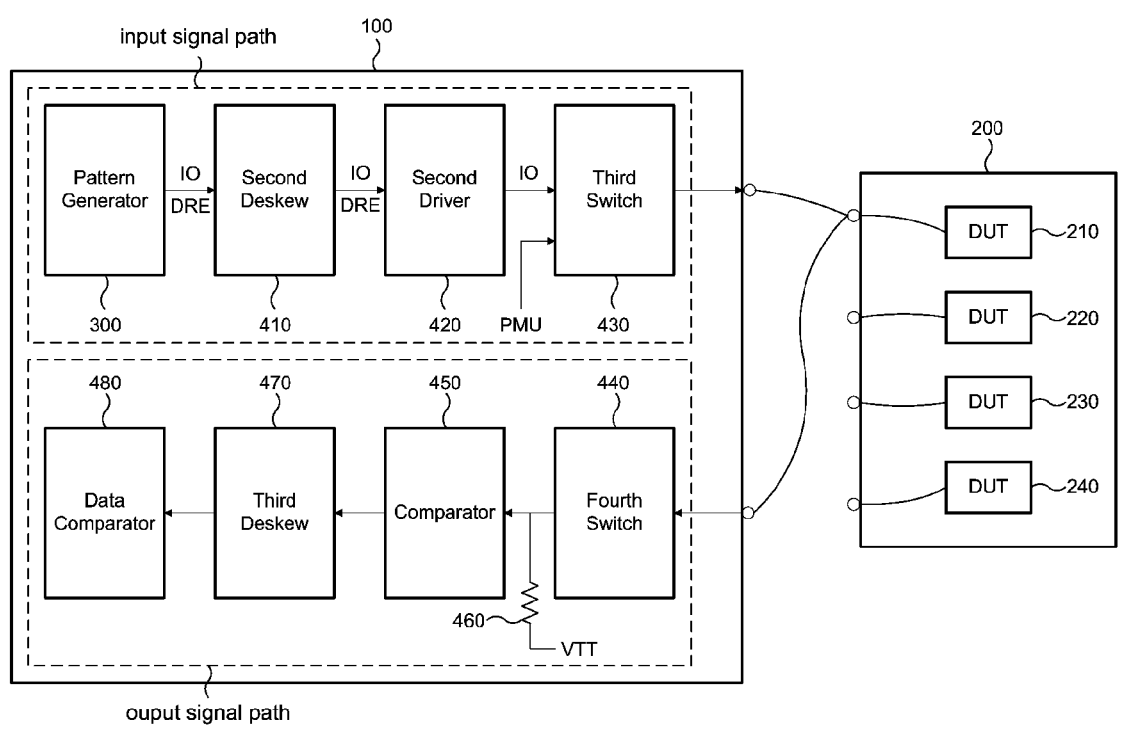
FIG. 3 is a block diagram illustrating an input/output signal path of a tester for testing a semiconductor device in accordance with the present invention.

FIG. 3 is a block diagram illustrating an input/output signal path of the tester for testing the semiconductor device in accordance with the present invention, wherein the input/output signal path refers to a path via which various test pattern signals are transmitted to a test signal input terminal of a DUT (input signal path) and an output signal being outputted from a test signal output terminal of the DUT are transmitted to a comparator for a comparison (output signal path).

Referring to FIG. 3, the tester for testing the semiconductor device in accordance with the present invention comprises the pattern generator 300, the DUT interface board 200 and a data comparator 480 in addition, the tester in accordance with the present invention may further comprise a second deskew 410, a second driver 420, a third switch 430, a fourth switch 440, a threshold comparator 450, a second terminator 460 and a third deskew 470.

The pattern generator 300, the second deskew 410, the second driver 420, the third switch 430, the fourth switch 440, the threshold comparator 450, the data comparator 480 and the third deskew 470 may be disposed on the PGB.

The pattern generator 300 generates and outputs the drive signal DR, the input signal IO and the drive enable signal DRE.

The pin corresponding to the test signal input terminal of the plurality of sockets disposed on the DUT interface board 200 corresponds to a test signal output terminal of the pattern generator 300 by 1:1. That is, while the drive signal input terminals are connected to form the daisy chain, one channel is allocated per test input signal terminal of the DUT. Therefore, FIG. 3 shows only one channel, and a plurality of input/output paths may be configured according to the number of the DUTs.

The second deskew 410 is disposed between the pattern generator 300 and the DUT interface board 200 to remove a skew of the drive enable signal and the input signal being outputted from the pattern generator 300. Since a plurality channels are required for simultaneously testing the plurality of DUTs, the second deskew 410 maintains a timing of the signals transmitted through the plurality channels constant.

The second driver 420 applies the input signal having the skew thereof removed to the test signal input terminal of each of the plurality of DUTs. In addition, when an output signal is outputted from the test signal output terminal, i.e. when a data stored in the DUT is read for a comparison, the second driver 420 terminates the output signal so as to prevent the reflection at an output terminal of the second driver 420. In FIG. 3, 'VH' denotes a mode for outputting the test input signal of a high level, 'VL' denotes a mode for outputting the test input signal of a low level, and 'VT' denotes a termination mode.

The third switch 430 disposed between the second driver 420 and the DUT interface board 200 applies one of the input signal having the skew thereof removed and the DC test signal to the DUT interface board 200. The third switch 430 may comprise relays. It is preferable that the relay that relays the input signal has the small turn-on resistance in order to minimize the distortion of the signal. In addition, it is preferable that the relay that relays the DC test signal has the small turn-off capacitance.

The fourth switch 440 disposed between the DUT interface board 200 and the threshold comparator 450 is opened when the third switch 430 applies the DC test signal. The fourth switch 440 may comprise a relay. It is preferable that the relay has the small turn-on resistance. It is preferable that the relays included in the third switch 430 and the fourth switch 440 the small insertion loss and the small return loss.

The threshold comparator 450 outputs a signal having a logic value of 'H' or 'L' according to a signal being outputted from the DUT 210. That is, when the output signal is higher than a predetermined value, the signal having the logic value of 'H' is outputted, and when the output signal is lower than the predetermined value, the signal having the logic value of 'L' is outputted, It is preferable that the threshold comparator 450 is a threshold comparator. In case of a conventional CMOS or TTL comparator, the logic values of 'H' and 'L' are distinguished by a window comparison method. However, in case of a reference voltage level interface such as a SSTL and a HSTL, a threshold comparison is more effective since the logic values of 'H' and 'L' are distinguished by a small voltage difference from a reference voltage. In addition, a transition voltage of the logic values of 'H' and 'L' of a data is accurately configured using a hysterisis function of the comparator.

The second terminator 460 may be connected to an input terminal of the threshold comparator 450. The second terminator 460 terminates the output signal being inputted to the input terminal of the threshold comparator 450 so as to prevent a reflection.

The third deskew 470 may be connected to an output terminal of the threshold comparator 450. The third deskew 470 removes a skew of an output signal of the threshold comparator 450 prior to carrying out a comparison of the data.

The data comparator 480 compares the output signal being outputted from the test signal output terminal of the DUT to the input signal. That is, when the input signal (test signal) is applied to the test signal input terminal of the DUT, the test signal is stored in the DUT. The stored test signal (the output signal) is read to be compared with the test signal which includes an expected data, thereby determining whether the semiconductor device is defective.

A process for transmitting the test signal in the tester for testing the semiconductor device in accordance with the present invention will be described in detail.

A signal path from the pattern generator 300 to the test signal input terminal of the DUT is defined as an input signal path, and a signal path from the test signal output terminal of the DUT to the data comparator 480 is defined as an output signal path. A process of transmitting the input signal along the input signal path and a process of transmitting the output signal along the output signal path are described.

The process of transmitting the input signal along the input signal path is as follows.

The input signal and the drive enable signal generated by the pattern generator 300 are inputted to the second deskew 410 to have the skew thereof removed.

The input signal and the drive enable signal having the skew thereof removed are inputted to the second driver 420. The input signal having the skew thereof removed is converted to the signal having the logic value of 'H' or 'L' in the second driver 420 according to the drive enable signal to be applied to the DUT 210 of the DUT interface board 200. During the process, the DC test signal may be applied to the DUT 210 of the DUT interface board 200 by a switching of the third switch 430.

The input signal that passed through the third switch 430 is stored in the DUT 210.

The process of transmitting the output signal along the output signal path is as follows.

When the output signal is outputted in order to read the data stored in the DUT 210, the second driver 420 enters the termination mode to prevent the reflection of the output signal at the output terminal of the second driver 420.

The output signal is inputted to the threshold comparator 450 through the fourth switch 440.

The threshold comparator 450 outputs the signal having the logic value of 'H' or 'L' according to the output signal being outputted from the test signal output terminal.

The second terminator 460 is disposed at the input terminal of the data comparator 480 in order to prevent the reflection of the output signal being inputted to the data comparator 480.

The output signal of the threshold comparator 450 is applied to the third deskew 470 to be removed of the skew. The output signal is then applied to the data comparator 480. It is preferable that the skew is removed through the third deskew 470 in order to receive the data from the plurality of DUTs through the plurality of channels.

The data comparator 480 compares the output signal having the skew removed to the input signal. That is, the test signal (output signal) stored in the DUT is compared to the signal inputted to the DUT to determine a corresponding device or cell as a defective device or cell when the input signal and the output signal are not the same.

As described above, the tester for testing the semiconductor device in accordance with the present invention is configured to have the different drive signal path and input/output signal path such that more DUTs may be tested simultaneously and the integrity of the signals is secured.

While the present invention has been particularly shown and described with reference to the preferred embodiment thereof, it will be understood by those skilled in the art that various changes in form and details may be effected therein without departing from the spirit and scope of the invention.

The invention claimed is:

1. A tester for testing a semiconductor device, the tester comprising:
   a drive signal path for applying a drive signal to a drive signal input terminal of each of a plurality of DUTs;
   an input signal path for applying an input signal to a test signal input terminal of each of the plurality of DUTs; and
   an output signal path for comparing an output signal being outputted from a test signal output terminal of each of the plurality of DUTs with the input signal,
   wherein the drive signal input terminal of each of the plurality of DUTs in the drive signal path is connected so as to form a daisy chain, and the input signal is applied to the test signal input terminal of each of the plurality of DUTs in the input signal path.

2. The tester in accordance with claim 1, wherein the drive signal path comprises:
   a pattern generator for outputting the drive signal;
   a first deskew for removing a skew of the drive signal being outputted from the pattern generator;
   a first driver for applying the drive signal having the skew thereof removed to the daisy chain; and
   a first terminator connected to an end of the daisy chain.

3. The tester in accordance with claim 1, wherein the input signal path comprises:
   a pattern generator for outputting a drive enable signal and the input signal;
   a second deskew for removing a skew of the drive enable signal and the input signal being outputted from the pattern generator; and
   a second driver for applying the input signal having the skew thereof removed to the test signal input terminal of each of the plurality of DUTs.

4. The tester in accordance with claim 3, wherein the second driver terminates the output signal at an output terminal of the second driver so as to prevent a reflection thereof when the output signal is outputted from the test signal output terminal of each of the plurality of DUTs.

5. The tester in accordance with claim 1, wherein the output signal path comprises:
   a comparator for receiving the output signal being outputted from the test signal output terminal of each of the plurality of DUTs to output a logic value of 'H' when the output signal is higher than a predetermined value and a logic value of 'M' when the output signal is lower than the predetermined value; and
   a second terminator for terminating the output signal being inputted to an input terminal of the comparator.

6. The tester in accordance with claim 5, wherein the output signal path further comprises a data comparator for comparing the output signal being outputted from the test signal output terminal of each of the plurality of DUTs with the input signal.

7. A tester for testing a semiconductor device, the tester comprising:
   a DUT interface board for mounting a plurality of DUTs, wherein a drive signal input terminal of each of the plurality of DUTs is connected to each other so as to form a daisy chain;
   a pattern generator for generating a drive signal, an input signal and a drive enable signal;
   a first deskew for removing a skew of the drive signal;
   a second deskew for removing a skew of the drive enable signal and the input signal;
   a first driver for applying the drive signal being outputted from the first deskew to the daisy chain;
   a second driver for applying the input signal being outputted from the second deskew to a test signal input terminal of each of the plurality of DUTs according to the drive enable signal being outputted from the second deskew; and
   a data comparator for comparing an output signal being outputted from the test signal output terminal of each of the plurality of DUTs with the input signal.

* * * * *